(12) United States Patent
Saarnivala et al.

(10) Patent No.: US 11,503,134 B2
(45) Date of Patent: Nov. 15, 2022

(54) ELECTRONIC DEVICE SUBSCRIPTION

(71) Applicants: ARM IP LIMITED, Cambridge (GB); ARM LIMITED, Cambridge (GB)

(72) Inventors: Mikko Johannes Saarnivala, Oulu (FI); Szymon Sasin, Oulu (FI); Yongbeom Pak, Oulu (FI); Hannes Tschofenig, Tirol (AT)

(73) Assignees: Arm IP Limited, Cambridge (GB); Arm Limited, Cambridge (GB)

( * ) Notice: Subject to any disclaimer, the term of this patent is extended or adjusted under 35 U.S.C. 154(b) by 0 days.

(21) Appl. No.: 17/310,367

(22) PCT Filed: Jan. 9, 2020

(86) PCT No.: PCT/GB2020/050046
§ 371 (c)(1),
(2) Date: Jul. 29, 2021

(87) PCT Pub. No.: WO2020/157452
PCT Pub. Date: Aug. 6, 2020

(65) Prior Publication Data
US 2022/0021741 A1    Jan. 20, 2022

(30) Foreign Application Priority Data
Feb. 1, 2019    (GB) .................................... 1901419

(51) Int. Cl.
*H04W 4/70*    (2018.01)
*H04L 65/1073*    (2022.01)
(Continued)

(52) U.S. Cl.
CPC .......... *H04L 67/55* (2022.05); *H04L 65/1073* (2013.01); *H04L 67/04* (2013.01);
(Continued)

(58) Field of Classification Search
None
See application file for complete search history.

(56) References Cited

U.S. PATENT DOCUMENTS

2005/0209990 A1    9/2005    Ordille et al.
2017/0099332 A1*   4/2017    Bullotta .................. H04L 67/02
(Continued)

FOREIGN PATENT DOCUMENTS

CN            108833331 A        11/2018

OTHER PUBLICATIONS

Nec, et al., "Covers AccessControlPolicy, labels and creator", ARC-2014-0178R03-Attribute Consistency.Doc, ONEM2M, vol. WG2—Architecture, ARC, Mar. 28, 2014 (Mar. 28, 2014), pp. 1-89, http://member.onem2m.org/Application/documentapp/downloadimmediate/default.aspx?docID=5450, whole document.

(Continued)

*Primary Examiner* — Schquita D Goodwin
*Assistant Examiner* — Jonathan A Sparks
(74) *Attorney, Agent, or Firm* — Patterson Thuente Pedersen, P.A.

(57) ABSTRACT

Broadly speaking, embodiments of the present technique provide methods, apparatuses and systems for controlling device resource subscriptions by an LwM2M server, comprising receiving at said LwM2M server a registration request message from a LwM2M client device, the message comprising an enumeration of a plurality of subscribable elements of an object hierarchy of the device; storing, using the LwM2M server, an association between the device and the plurality of subscribable elements; and sending from the LwM2M server to the LwM2M client device a subscription message comprising a unitary compressed expression representing plural ones of said plurality of subscribable elements associated with said device.

17 Claims, 5 Drawing Sheets

(51) Int. Cl.
*H04L 67/04* (2022.01)
*H04L 69/04* (2022.01)
*H04L 67/51* (2022.01)
*H04L 67/55* (2022.01)
*H04W 4/80* (2018.01)

(52) U.S. Cl.
CPC .............. *H04L 67/51* (2022.05); *H04L 69/04* (2013.01); *H04W 4/70* (2018.02); *H04W 4/80* (2018.02)

(56) References Cited

U.S. PATENT DOCUMENTS

2020/0213244 A1* 7/2020 Chang .................... H04L 67/55
2021/0409922 A1* 12/2021 Keränen ............... H04W 60/04

OTHER PUBLICATIONS

Combined Search and Examination Report corresponding to GB1901419.0 dated Aug. 1, 2019.
International Search Report and Written Opinion corresponding to PCT/GB2020/050046 dated Mar. 23, 2020.
International Preliminary Report on Patentability corresponding to PCT/GB2020/050046 dated Aug. 12, 2021.

* cited by examiner

ELECTRONIC DEVICE SUBSCRIPTION

The present techniques generally relate to electronic device resource subscriptions according to protocols for machine-to-machine communication, and particularly to the expression of subscribable elements in such subscriptions.

There are ever increasing numbers of devices within the home, other buildings or the outdoor environment that have processing and communication capabilities which allow them to communicate with other entities (e.g. devices, servers, services etc.) within the same network or on a different network (e.g. on the internet) to access servers or services as part of the "Internet of Things", whereby data is generally transmitted between devices and other entities using machine-to-machine (M2M) communication techniques.

For example, a temperature device in a home may gather sensed data and push the sensed data to a remote service (such as an application running in 'the cloud'). The temperature device may then be controlled remotely by the remote service via received command data.

In other examples, a pollution monitoring device in a factory may comprise a sensor to gather information from various chemical sensors and arrange maintenance based on the gathered information; whilst a healthcare provider may use devices comprising sensors, such as a heart rate monitor to track the health of patients while they are at home.

The present applicant has recognised the need for improved electronic device resource subscriptions according to protocols for machine-to-machine communication, and particularly to the expression of subscribable elements in such subscriptions.

According to a first technique there is provided a machine-implemented method for controlling device resource subscriptions by an LwM2M server, comprising receiving at said LwM2M server a registration request message from a LwM2M client device, the message comprising an enumeration of a plurality of subscribable elements of an object hierarchy of the device; storing, using the LwM2M server, an association between the device and the plurality of subscribable elements; and sending from the LwM2M server to the LwM2M client device a subscription message comprising a unitary compressed expression representing plural ones of said plurality of subscribable elements associated with said device.

In a hardware approach, there is provided electronic apparatus comprising logic elements operable to implement the methods of the present technology. In another approach, the computer-implemented method may be realised in the form of a computer program product, tangibly stored in a non-transitory storage medium, and operable in use to cause a computer system to perform the process of the present technology.

The techniques are diagrammatically illustrated, by way of example, in the accompanying drawings, in which.

Broadly speaking, embodiments of the present technique provide methods, apparatuses and systems for the control of electronic device resource subscriptions according to protocols for machine-to-machine communication, and particularly to the expression of subscribable elements in such subscriptions. Use of the present techniques when devices have registered plural subscribable elements of object instance hierarchies can reduce the size of the subscription messages.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. It should also be noted that directions and/or references, for example, such as up, down, top, bottom, and so on, may be used to facilitate discussion of drawings and are not intended to restrict application of claimed subject matter.

Data exchange between programs and computers is a vital element. Different programs, computers and processors may exchange data without human intervention. Different networks and protocols are used in different environments. On the Internet, the Transmission Control Protocol/Internet Protocol (TCP/IP) is the basic protocol used in communication. TCP/IP takes care of assembling and disassembling the data to be transmitted in packets. IP handles the addressing so that packets are delivered to the correct destination. Above TCP/IP, the Hypertext Transfer Protocol (HTTP) is used as a client/server protocol. A program may send an HTTP request to a server which responds with another HTTP message.

Figure 1:
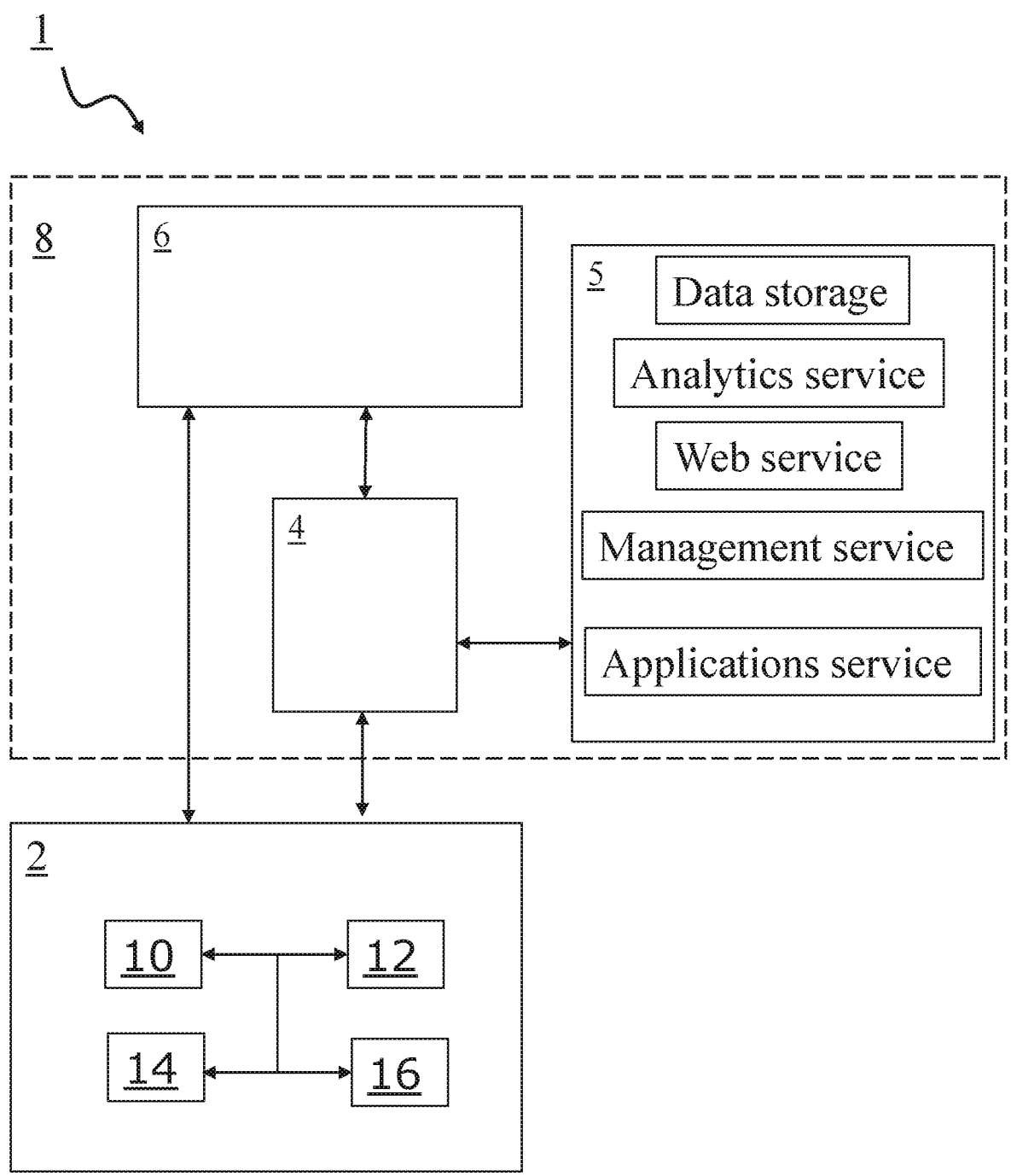
FIG. 1 shows an example deployment scenario 1 for a device 2 according to the present techniques.

FIG. 1 shows a deployment scenario 1 for a device 2 according to the present techniques.

Device 2 may be a computer terminal, a laptop, a tablet or mobile-phone, or may, for example, be a lightweight M2M (LwM2M) device running an LwM2M client. Device 2 can be used to turn objects into "smart-objects" such as streetlights, electric meters, temperature sensors and building automation, healthcare, and a range of other market segments as part of the IoT. It will be appreciated that the examples of market segments listed above are for illustrative purposes only and the claims are not limited in this respect. Device 2 is operable to communicate with one or more servers and/or services.

As described herein a server (depicted in FIG. 1 as "server 4" and "server 6") may be a single computing device or software running on a computing device. However, the claims are not limited in this respect and the server may comprise a plurality of interconnected computing devices (or software running on a plurality of interconnected devices), whereby the plurality of interconnected computing devices may be distributed over one or more public and/or private networks.

In the present figures server 4 may, for example, be a LwM2M server, an application server, an edge server, a computer terminal, a laptop, a tablet or mobile-phone, or an application hosted on a computing device, and which provides deployment of one or more services (depicted in FIG. 1 as "service 5"). Such services may include one or more of:

web service(s); data storage service; analytics service(s), management service(s) and application service(s), although this list is not exhaustive.

In the present figures server 6 comprises a bootstrap server which is used to provision resources on the device 2. In embodiments, bootstrap server 5 may be any type of server or remote machine and may not necessarily be a dedicated bootstrap server. Generally speaking the bootstrap server 6 is any means suitable to perform a bootstrap process with the device 2 (e.g. machine, hardware, technology, server, software, etc.).

In the present examples, the server 4, bootstrap server 6 and/or services 5 may form part of a device management platform 8 such as the Pelion™ device management platform from Arm®, Cambridge, UK.

The device 2 comprises communication circuitry 10 for communicating with the one or more servers 4 and/or services 5.

The communication circuitry 10 may use wireless communication, such as communication such as, for example, one or more of: wireless local area network (Wi-Fi); short range communication such as radio frequency communication (RFID); near field communication (NFC); communications used in wireless technologies such as Bluetooth®, Bluetooth Low Energy (BLE); cellular communications such as 3G or 4G; and the communication circuitry 10 may also use wired communication such as a fibre optic or metal cable. The communication circuitry 10 could also use two or more different forms of communication, such as several of the examples given above in combination.

It will be appreciated that the device 2 could also use any suitable protocols for communications including one or more of: IPv6, IPv6 over Low Power Wireless Standard (6LoWPAN®), Constrained Application Protocol (CoAP), Message Queuing Telemetry Transport (MQTT), Representational state transfer (REST), HTTP, WebSocket, ZigBee®, and Thread®, although it will be appreciated that these are examples of suitable protocols.

As an illustrative example, CoAP defines the message header, request/response codes, message options and retransmission mechanisms, such as, for example, Representational State Transfer (RESTful) Application Programming Interfaces (APIs) on resource-constrained devices and supports the methods of GET, POST, PUT, DELETE, which can be mapped to methods of the HTTP protocol.

M2M communications are typically required to be secure to reduce the risk that malicious third parties gain access to the data, or to limit the access to data, by devices, servers or services. The device may use one or more security protocols to establish a communications path or channel for providing secure communications between entities. Exemplary security protocols may, for example, comprise Transport Layer Security (TLS) and Datagram Transport Layer Security (DTLS), whereby TLS/DTLS may be used to establish a secure channel between the device 2 and server 4 whereby TLS/DTLS include establishing communications using, certificates (e.g. X.509 certificates) and both pre-shared key and public key technology. The data (e.g. credential data) protected by TLS/DTLS may be encoded as plain text, binary TLV, JSON, CBOR, or any other suitable data exchange format.

The device 2 further comprises processing circuitry 12 for controlling various processing operations performed by the device 2.

The device 2 may further comprise input/output (I/O) circuitry 14, such that the device 2 can receive inputs (e.g. user inputs, sensor inputs, measurement inputs etc.) and or generate outputs (e.g. audio/visual/control commands etc.).

The device 2 further comprises storage circuitry 16 for storing resources, such as credential data, whereby the storage circuitry 16 may comprise volatile and/or non-volatile memory.

Such credential data may include one or more of: certificates, cryptographic keys (e.g. shared symmetric keys, public keys, private keys), identifiers (e.g. direct or indirect identifiers) whereby such credential data may be used by the device to authenticate (e.g. connect, establish secure communications, register, enroll etc.) with one or more remote entities (e.g. a bootstrap server/server/services).

Figure 2A:
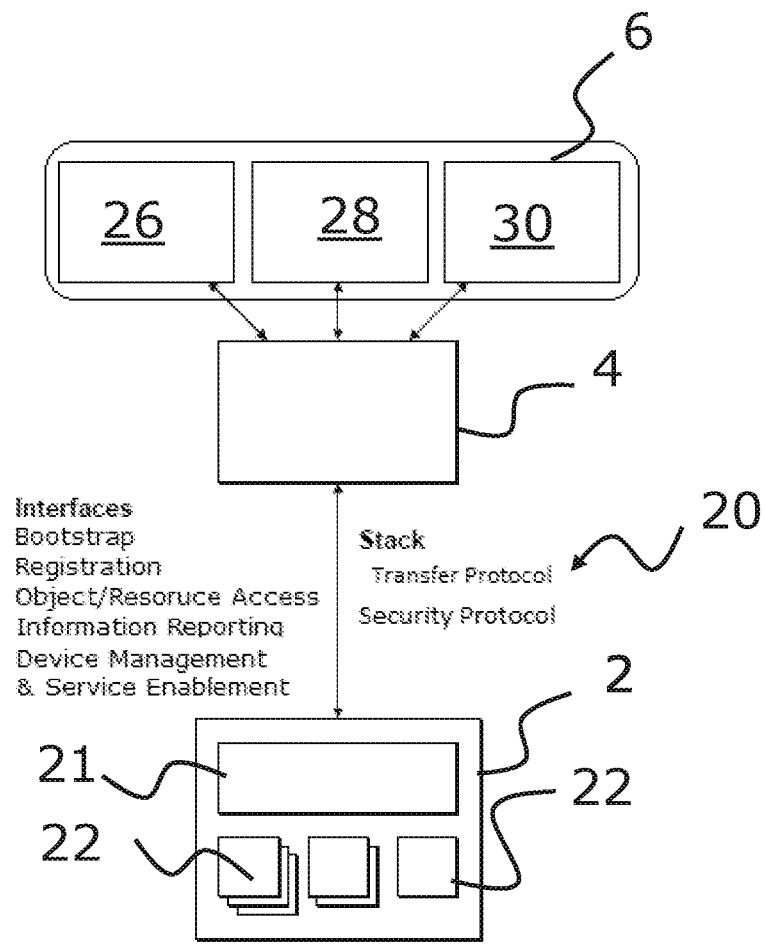
FIG. 2a shows an example architecture depicting a client-server relationship between the device of FIG. 1 and a server.
Figure 2B:
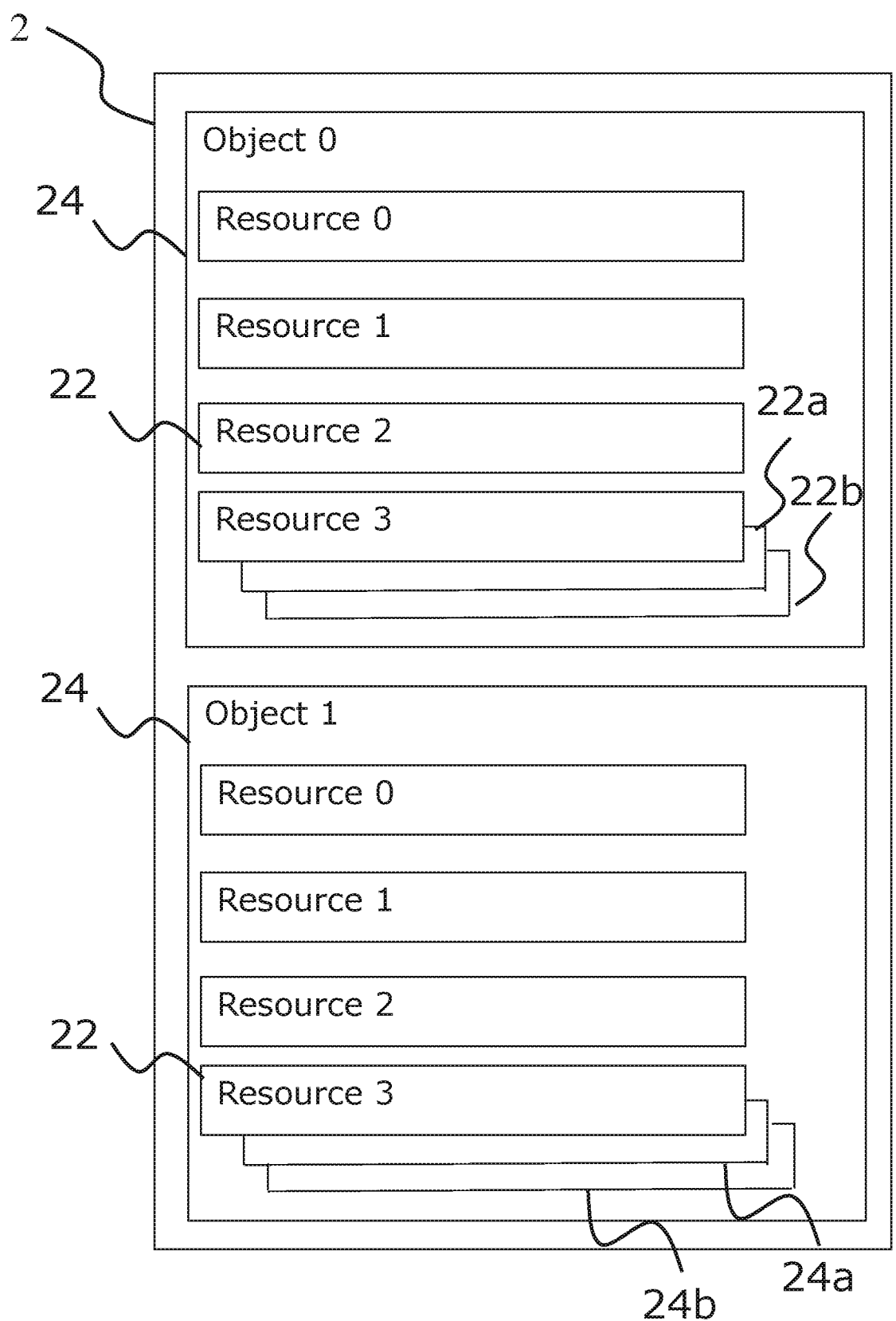
FIG. 2b shows a schematic diagram of an object model on the device of FIG. 1.

FIG. 2a illustratively shows an example architecture 20 which illustrates a client-server relationship between the device 2 and server 4. FIG. 2b illustratively shows a schematic diagram of an object model on device 2.

Device 2 is hereafter referred to as "client device" but may also be referred to herein as a 'device', 'node device', 'node', 'end-user device' or 'user device'.

In the following examples the server 4 is depicted as a LwM2M server, such that the LwM2M server 4 and client device 2 communicate using protocols compliant with the Open Mobile Alliance (OMA) LWM2M specification.

The client device 2 comprises client 21 which may be integrated as a software library or built-in function of a module and which is used in communications with the LwM2M server 4. The client 21 may, for example, be an LwM2M client device.

Logical interfaces may be defined between the client 21 and LwM2M server 4, and three logical interfaces are depicted in FIG. 2, namely:

'Client Registration' interface may be used to perform and maintain registration with one or more servers and de-register from a server.

'Device management and service enablement' interface may be used by one or more servers to access object instances and resources available at the client device 2.

'Information Reporting' interface may be used to enable one or more servers to observe any changes in a resource on client device 2, and for receiving notifications when new values are available.

This list of logical interfaces is exemplary only and additional, or alternative, logical interfaces between the client 21 and LwM2M server 4 may be provided, for example, in accordance with various current or future versions of the OMA LwM2M specification.

The device 2 comprises various resources 22, which can be read, written, executed and/or accessed by the LwM2M server 4 or one or more further servers/services.

As an illustrative example, a resource is one which has a given value (e.g. generated by circuitry on the device). A web application may, via LwM2M server 4, request the value from the client device 2 (e.g. with a REPORT request), whereby the requested value is read and reported back to the web application by the LwM2M server 4.

As a further illustrative example, a resource comprising credential data may be provisioned at manufacture (e.g. during a factory provisioning process) or during a communication session with a bootstrap server, and subsequently used to register with the LwM2M server 4.

As depicted in FIG. 2b, the resources 22 may be further logically organized into objects 24, whereby each device 2 can have any number of resources, each of which is part of an object 24. Objects and resources may comprise numerous instances, according to the requirements of the system and its applications.

A set of objects for device management purposes may include, for example:
- A 'security object' to handle security aspects between the client device 2 and one or more servers;
- A 'server object' to define data and functions related to a server;
- An 'access control object' to define for each of one or more permitted servers the access rights the one or more servers have for each object on the client device 2;
- A 'device object' to detail resources on the client device 2. As an example, the device object may detail device information such as manufacturer, model, power information, free memory and error information;
- A 'connectivity monitoring object' to group together resources on the client device 2 that assist in monitoring the status of a network connection;
- A 'firmware update object' enables management of firmware which is to be updated, whereby the object includes installing firmware, updating firmware, and performing actions after updating firmware;
- A 'location object' to group those resources that provide information about the current location of the client device 2;
- A 'connection statistics object' to group together resources on the client device 2 that hold statistical information about an existing network connection.

In embodiments, each object is assigned a unique object identifier, and each resource is also assigned a unique identifier within that Object. Therefore, the objects and resources can be accessed using a suitable identifier, such as a universal resource indicator (URI) in the form:
/{Object ID}/{Object Instance}/{Resource ID} e.g. /3/0/1.

In embodiments device 2 may have one or more instances of an object. As an illustrative example, a temperature sensor device may comprise two or more temperature sensors, and the client device may comprise a different device object instance for each temperature sensor.

The objects/resources on a device may be remotely accessed/managed by, for example, software hosted on a server (e.g. a bootstrap server, LwM2M server 4) or an application running as part of a service 5.

A basic type of resource is one which may have a given value. A web application may, via LwM2M server 4, request the value from the client device (e.g. with a REPORT request), whereby the requested value is read and reported back to the web application.

In an embodiment the LwM2M server 4 comprises, or has access to a resource directory at the device management platform (not shown in FIG. 2a or 2b), whereby the resources of the various client devices registered with the LwM2M server 4 are stored in the resource directory. Thus, the resource directory is a registry of the resources on one or more client devices registered with one or more servers. In embodiments the resource directory may be realized using a processor and a storing device such as a hard disc drive and a suitable application, a database application in a computer or it may be realized using cloud computing.

In an embodiment client device 2 registers with a LwM2M server 4 by sending a registration request and providing various data, such as identifying all the resources thereon. The LwM2M server 4 stores the identified resources in the resource directory for the client device 2. Once the data is in the resource directory the data can then be looked up and resources accessed as required.

As the number of resources on a client device increases, the size of the registration message will also increase and may impact the system capacity, especially when many devices attempt to register with the LwM2M server 4 at substantially the same time.

To simplify the registration procedure and reduce the size of the registration request, the LwM2M server may use resource templates, whereby a resource template defines a specific list of resources. In an illustrative example, when a client device 2 registers with the LwM2M server 4 and the resources on that client device 2 match the resources specified in a resource template in storage on the LwM2M server (or on the device management platform), the LwM2M server 4 can store the resources identified in the resource template in the resource directory for that client device 2.

In such a scenario the client device 2 can identify the resource template by providing a template identifier in the registration request, where the template identifier is provisioned on the client device 2 by bootstrap server 6 during a bootstrap process.

Such functionality means that the client device 2 is not required to send all of its resource identifiers to the LwM2M server 4, rather it just transmits the template identifier.

Whilst the server 4 above is generally depicted as a LwM2M server, the claims are not limited in this respect and in embodiments the server 4 may be an OMA Device Management (DM), a TR-069 server or a server which follows a standard/protocol set by the Open Connectivity Foundation or Open Interconnect Consortium.

Embodiments of the present techniques may provide implementations which conform to the Open Mobile Alliance Lightweight Machine to Machine Technical Specification, Version 1.0 and to one or more revision(s) thereof, including Version 1.3.

Figure 2C:
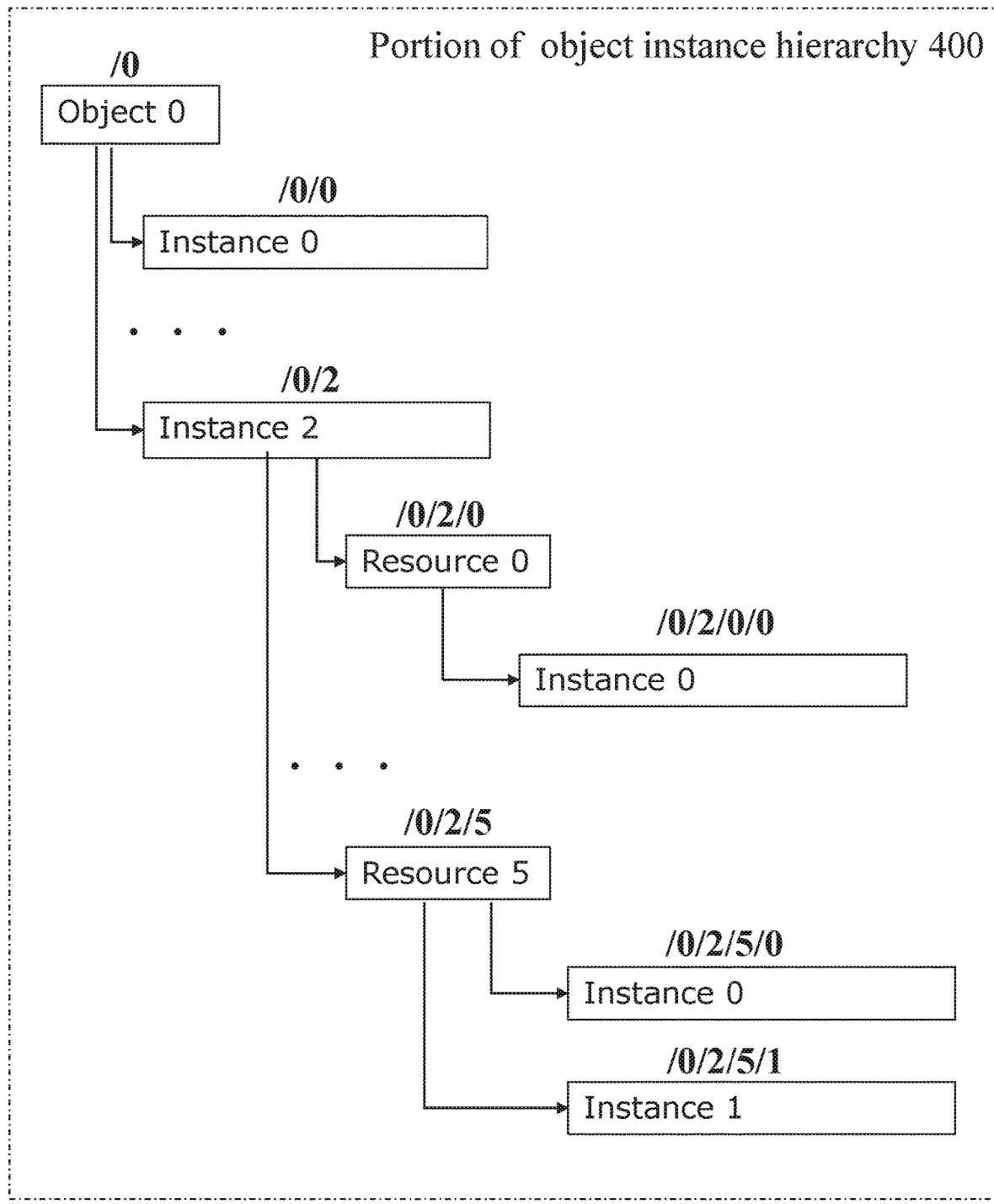
FIG. 2c shows a simplified representation of an object instance hierarchy according to an embodiment of the present technology.

Typically, in systems such as that contemplated in the present disclosure, a client device registers with a server with an enumeration of the subscribable elements of an object instance hierarchy. FIG. 2c shows one simplified example of a portion of such an object hierarchy, with omissions marked by elision marks ( . . . ). In FIG. 2c, Object 0 Instance 2 is shown as having a single instance of Resource 0 (that is, Resource 0 Instance 0), and two instances of Resource 5 (that is, Resource 5 Instance 0 and Resource 5 Instance 1). The elements of the hierarchy are further marked with a hierarchy notation showing the levels and elements within levels using a slash separator. It will be clear to one of ordinary skill in the art that this is merely one example of a hierarchy notation and is not intended to limit the structure of the hierarchies available using the present techniques. It will also be clear to those of skill in the art that real-world implementations of such hierarchies will be much larger, and that only a very simple example has been shown here.

In the hierarchy shown in FIG. 2c, an Object may represent an LwM2M Object as described above. Instances of such Objects are created according to the requirements of the system being implemented. Thus, for example, in a system for monitoring heating and cooling in a group of buildings, a Temperature Object may be defined having instances for each of the buildings. The Temperature Object instances may be defined to comprise Resources, such as a Current Temperature Resource, a Maximum Temperature Resource and a Minimum Temperature Resource, and each Resource may further comprise Instances for various temperature sensors.

On registration with a server, a device may then enumerate those elements of an object hierarchy that it can make available for subscription by the server to which it is becoming registered. The server then selects those elements of the object instance hierarchy from which it requires information, and creates a subscription message detailing the required subscribable elements of the object instance hierarchy. For example, a building services management application may require monitoring information on numerous aspects of the functioning of the installed systems.

As will be clear to one of skill in the art, a subscription message may represent a significant amount of data to be communicated. The provision of a unitary compressed expression that can represent a number of elements from an object hierarchy means that a single message may carry a server's subscriptions to, for example, a range of resources installed on a device. A unitary compressed expression encapsulates in a single expression the characteristics required of a plurality of subscribable elements, or otherwise identifies the plurality in a manner that requires less data than a fully-expressed representation, such as a list. In one example, a subscription message may comprise a unitary compressed expression in the form of a range from a first value to a second value, and the device is then operable to respond to any activity associated with the objects in that range by notifying the server.

Similarly, a subscription message may comprise a unitary compressed expression in the form of a string with a wildcard symbol, thus making the device operable to respond to any activity associated with any of the objects that fall within the group specified by the wildcarded string by notifying the server.

In a further example, a subscription message may comprise a unitary compressed expression in the form of a regular expression defining the criteria to be met by an object that will make the device operable to respond to any activity associated with any of the objects that fall within the group specified by the wildcarded string by notifying the server. For example, such a regular expression may specify a set of values identifying objects that have names containing a specified embedded string. A regular expression may comprise a specification of those parts of the definition of an object, resource or instance in the object hierarchy that are required to match the criteria, and it may contain indicators that some parts of the definition of an object, resource or instance in the object hierarchy are to be ignored.

In another example, the unitary compressed expression may be a hash representing plural ones of the plurality of subscribable elements, for example a hash representation of a sequence of branches in a tree structure, or it may a bitmap representing plural ones of said plurality of subscribable elements as a mapping over a data structure. It will be clear to one of ordinary skill in the art that these are merely examples, and that the unitary compressed expression may take many other forms, according to the requirements of the application that is the consumer of the information provided by the device in response to activity associated with the subscribed-to object, resource or instance in the object hierarchy.

Figure 3:
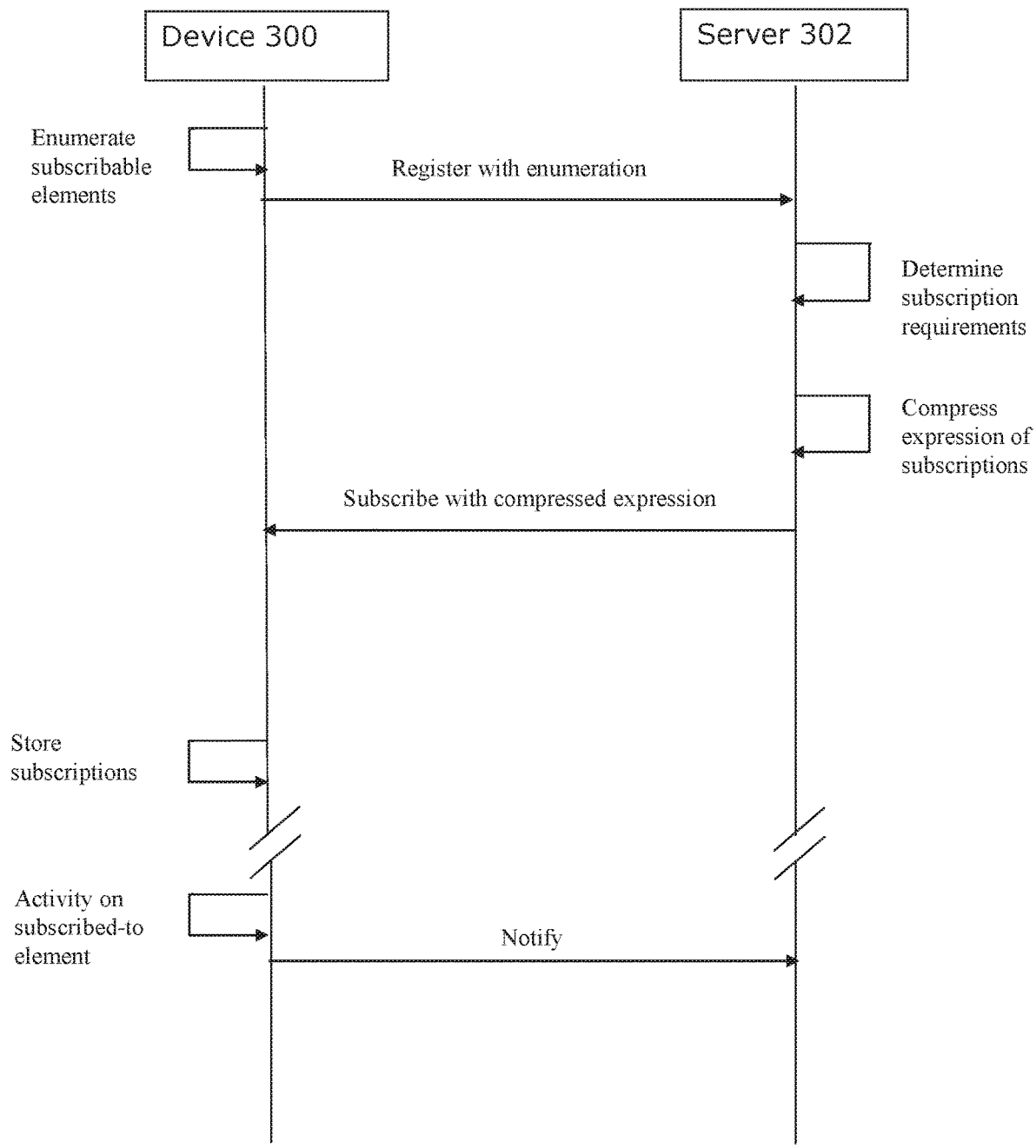
FIG. 3 shows some of the communication flows of one possible implementation of the present technique.

Turning now to FIG. 3, there is shown a simplified representation of the behaviour of a device 300, such as an LwM2M client device as described above, and a server 302, which may be an LwM2M server as described above.

In FIG. 3, device 300 prepares to register with server 302 by enumerating the elements of its object hierarchy: objects, resources and instances as previously described. Device 300 sends its registration message with this enumeration to server 302, thus providing server 302 with a complete set of information about the subscribable elements that are available at device 300, which it stores in some accessible storage in association with an identifier of the device to which the information pertains. Server 302, responsive to system and application requirements, determines its requirements for subscriptions for device 300. Server 302 then creates, according to these requirements, a message comprising a unitary compressed expression representing plural ones of the plurality of subscribable elements associated with the device, and thus compresses the expression of the subscriptions for transmission to device 300. In one very simple example, server 302 requires notification of any activity on any of subscribable elements 33/5/1, 33/5/2, 33/5/3 and 33/5/4; server 302 thus constructs a unitary compressed expression in the form "33/5/1-4" and creates a subscription message comprising this formulation. This will cause device 300 to send a notification when any activity occurs on any one or more of subscribable elements 33/5/1, 33/5/2, 33/5/3 and 33/5/4. In another example, where server 302 requires notification of any activity on any of the subscribable elements in the set 33/5, it constructs a unitary compressed expression in the form "33/5/*" and creates a subscription message comprising this formulation.

Server 302 sends its subscription message with the unitary compressed expression to device 300. Device 300 stores the received subscriptions in some accessible storage, so that, on subsequent detection of activity on any of the subscribed-to elements, it can notify server 302 in a manner that is in accordance with server 302's system or application requirements.

In this way, the present techniques may provide methods, apparatus and systems for controlling device resource subscriptions by a server, such as an LwM2M server. The LwM2M server receives a registration request message from a LwM2M client device, the message comprising an enumeration of a plurality of subscribable elements of an object hierarchy of the device. The object hierarchy may contain definitions of objects, object instances, resources contained in the objects, and instances of those resources. The device enumerates those objects, object instances, resources contained in the objects, and instances of those resources associated with it in the message, so that a server may select those from which it requires data. The LwM2M server stores in some accessible store an association between the device and the plurality of subscribable elements; this may take the form of a data structure, such as a table, and may be controlled using, for example, database technology. The LwM2M server is then operable as required to send to the LwM2M client device a subscription message specifying those subscribable elements to which it requires subscription. To reduce the data payloads of subscription messages, the server may be operable to create a message comprising a unitary compressed expression representing plural ones of the plurality of subscribable elements associated with the device. The unitary compressed expression, when interpreted by the LwM2M client device, causes the LwM2M client device to store the expression of the subscription to its accessible storage, so that, as triggered by activity associated with any of the plural ones of the plurality of subscribable elements associated with the device, it is operable to notify the server, and thus fulfil the server's subscription request.

In a further refinement, notification messages may also make use of the unitary compressed expression of the present technology. Thus, for example, a client device may send a notification of the form "/0/1,2/0" (i.e. naming two different object instances in an object hierarchy as described above), followed by a pair of values for the 1,2 pairing and which are correspondingly comma-separated. In a further example, the notification may take the form "/0/1-4/0" followed by four different values corresponding to the range 1-4. Similarly, a notification message may be structured using a wildcard character or characters, followed by the set of values that satisfy the wildcarded expression. It will be clear to one of skill in the art that these are merely examples, and that any suitable form of compressed expression may equally be used in this way, accompanied by the corresponding values, to construct a notification message.

Embodiments of the present techniques may also provide a non-transitory data carrier carrying code which, when implemented on a processor, causes the processor to carry out the methods described herein.

The techniques further provide processor control code to implement the above-described methods, for example on a general-purpose computer system or on a digital signal processor (DSP). The techniques also provide a carrier carrying processor control code to, when running, implement any of the above methods, in particular on a non-transitory data carrier or on a non-transitory computer-readable medium such as a disk, microprocessor, CD- or DVD-ROM, programmed memory such as read-only memory (firmware), or on a data carrier such as an optical or electrical signal carrier. The code may be provided on a (non-transitory) carrier such as a disk, a microprocessor, CD- or DVD-ROM, programmed memory such as non-volatile memory (e.g. Flash) or read-only memory (firmware). Code (and/or data) to implement embodiments of the techniques may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog™ or VHDL (Very high speed integrated circuit Hardware Description Language). As the skilled person will appreciate, such code and/or data may be distributed between a plurality of coupled components in communication with one another. The techniques may comprise a controller which includes a microprocessor, working memory and program memory coupled to one or more of the components of the system.

Computer program code for carrying out operations for the above-described techniques may be written in any combination of one or more programming languages, including object-oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

It will also be clear to one of skill in the art that all or part of a logical method according to the preferred embodiments of the present techniques may suitably be embodied in a logic apparatus comprising logic elements to perform the steps of the above-described methods, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In an embodiment, the present techniques may be realised in the form of a data carrier having functional data thereon, the functional data comprising functional computer data structures to, when loaded into a computer system or network and operated upon thereby, enable the computer system to perform all the steps of the above-described method.

Those skilled in the art will appreciate that while the foregoing has described what is considered to be the best mode and where appropriate other modes of performing present techniques, the present techniques should not be limited to the specific configurations and methods disclosed in this description of the preferred embodiment. Those skilled in the art will recognise that present techniques have a broad range of applications, and that the embodiments may take a wide range of modifications without departing from the any inventive concept as defined in the appended claims.

The invention claimed is:

1. A machine-implemented method for controlling device resource subscriptions by an LwM2M server, comprising:
   receiving at said LwM2M server a registration request message from a LwM2M client device, the message comprising an enumeration of a plurality of subscribable elements of an object hierarchy of the device;
   storing, using the LwM2M server, an association between the device and the plurality of subscribable elements; and,
   sending from the LwM2M server to the LwM2M client device a subscription message comprising a unitary compressed expression representing plural ones of said plurality of subscribable elements associated with said device.

2. The machine-implemented method of claim 1, said sending said unitary compressed expression comprising sending a unitary regular expression identifying two or more said subscribable elements by criteria to be matched.

3. The machine-implemented method of claim 2, said unitary regular expression comprising a wildcard indicator indicating that any subscribable element having any value at the wildcard position is a valid match for the criteria.

4. The machine-implemented method of claim 2, said unitary regular expression comprising a value range indicator specifying a range between a first value and a second value indicating that any subscribable element falling within the range is a valid match for the criteria.

5. The machine implemented method of claim 1, sending said unitary compressed expression comprising sending a hash representing plural ones of said plurality of subscribable elements.

6. The machine implemented method of claim 1, sending said unitary compressed expression comprising sending a bitmap representing plural ones of said plurality of subscribable elements in a data structure.

7. The machine machine-implemented method of claim 1, said plurality of subscribable elements comprising at least one of objects, resources and instances.

8. A machine-implemented method for controlling device notifications by an LwM2M device, comprising:
   receiving at said LwM2M device a subscription request message from an LwM2M server;
   deriving from said subscription request a unitary compressed expression representing plural ones of a plurality of subscribable elements in an object hierarchy associated with the device;
   storing subscriptions for said plurality of subscribable resources; and, responsive to activity by at least one of said plurality of subscribable elements, sending a notification message to the LwM2M server.

9. The machine-implemented method of claim 8, said deriving said unitary compressed expression comprising expanding said unitary compressed expression to produce a full representation identifying two or more subscribable elements.

10. The machine-implemented method of claim 8, said deriving said unitary compressed expression comprising deriving a unitary regular expression identifying two or more subscribable elements.

11. The machine-implemented method of claim 10, said unitary regular expression comprising a wildcard indicator indicating that any subscribable element having any value at the wildcard position is a valid match for the criteria.

12. The machine-implemented method of claim 10, said unitary regular expression comprising a value range indicator specifying a range between a first value and a second value indicating that any subscribable element falling within the range is a valid match for the criteria.

13. The machine implemented method of claim 8, receiving said unitary compressed expression comprising receiving a hash representing plural ones of said plurality of subscribable elements.

14. The machine implemented method of claim 8, receiving said unitary compressed expression comprising receiving a bitmap representing plural ones of said plurality of subscribable elements in a data structure.

15. The machine-implemented method of claim 8, said sending a notification message to the LwM2M server comprising sending a unitary compressed expression identifying plural ones of said plurality of subscribable elements in a data structure and attaching corresponding data values for said plural ones.

16. A computer program comprising computer readable code to, when loaded into a computer and executed thereon, cause the computer to perform the method according to claim 1.

17. Apparatus comprising electronic logic operable to perform the method according to claim 1.

* * * * *